(12) United States Patent
Reese et al.

(10) Patent No.: US 10,872,183 B2
(45) Date of Patent: Dec. 22, 2020

(54) GEOMECHANICAL RISK AND HAZARD ASSESSMENT AND MITIGATION

(71) Applicants: Michael Reese, Youngsville, LA (US); Shauna Brown, The Woodlands, TX (US); Malcolm Sim, Peterhead (GB); John David D'Alessandro, The Woodlands, TX (US)

(72) Inventors: Michael Reese, Youngsville, LA (US); Shauna Brown, The Woodlands, TX (US); Malcolm Sim, Peterhead (GB); John David D'Alessandro, The Woodlands, TX (US)

(73) Assignee: BAKER HUGHES, A GE COMPANY, LLC, Houston, TX (US)

( * ) Notice: Subject to any disclaimer, the term of this patent is extended or adjusted under 35 U.S.C. 154(b) by 402 days.

(21) Appl. No.: 15/785,484

(22) Filed: Oct. 17, 2017

(65) Prior Publication Data

US 2018/0113966 A1    Apr. 26, 2018

Related U.S. Application Data

(60) Provisional application No. 62/410,991, filed on Oct. 21, 2016.

(51) Int. Cl.
*G06F 30/20*     (2020.01)
*E21B 41/00*     (2006.01)
(Continued)

(52) U.S. Cl.
CPC .............. *G06F 30/20* (2020.01); *E21B 41/00* (2013.01); *E21B 41/0092* (2013.01);
(Continued)

(58) Field of Classification Search
CPC .. G06F 17/5009; E21B 41/00; E21B 41/0092; E21B 44/00; E21B 49/00; E21B 7/04
(Continued)

(56) References Cited

U.S. PATENT DOCUMENTS 7,003,439 B2 *   2/2006   Aldred .................... E21B 44/00
                                                      703/10
7,357,196 B2     4/2008   Goldman et al.
(Continued)

FOREIGN PATENT DOCUMENTS

WO        2015168417 A1    11/2015

OTHER PUBLICATIONS

Eric Cayeux and Benoit Daireaux, Automatic Performance Analysis and Estimation of Risk Level Embedded in Drilling Operation Plans, SPE-181018-MS, Sep. 6-8, 2016, pp. 1-33 (Year: 2016).*
(Continued)

*Primary Examiner* — Justin C Mikowski
(74) *Attorney, Agent, or Firm* — Cantor Colburn LLP

(57) ABSTRACT

Examples of techniques for geomechanical risk and hazard assessment and mitigation are disclosed. In one example implementation, a method may include generating, by a processor, a geomechanical model for a location for drilling a borehole; performing a risk assessment to identify at least one risk associated with drilling the borehole; updating, by the processor, the geomechanical model as a pre-drill updated geomechanical model by applying a mitigation solution to mitigate the at least one risk associated with drilling the borehole; generating, by the processor, a drilling plan for drilling the borehole based on the pre-drill geomechanical model; and drilling the borehole based on the drilling plan.

12 Claims, 5 Drawing Sheets

(51) Int. Cl.
  *E21B 44/00* (2006.01)
  *E21B 49/00* (2006.01)
  *E21B 7/04* (2006.01)
(52) U.S. Cl.
  CPC .............. *E21B 44/00* (2013.01); *E21B 49/00* (2013.01); *E21B 7/04* (2013.01)
(58) Field of Classification Search
  USPC .......................................................... 703/10
  See application file for complete search history.

(56) References Cited

U.S. PATENT DOCUMENTS

| | | | | |
|---|---|---|---|---|
| 8,527,248 | B2* | 9/2013 | Thambynayagam | ... E21B 44/00 703/10 |
| 8,931,580 | B2* | 1/2015 | Cheng | ..................... E21B 43/30 175/45 |
| 9,777,559 | B2* | 10/2017 | Zhan | ........................ E21B 43/12 |
| 2002/0104685 | A1* | 8/2002 | Pinckard | ................. E21B 7/068 175/61 |
| 2005/0209866 | A1* | 9/2005 | Veeningen | ............. G06Q 10/06 705/7.28 |
| 2005/0209912 | A1* | 9/2005 | Veeningen | ............. G06Q 10/06 705/7.12 |
| 2005/0211468 | A1* | 9/2005 | Veeningen | ................ E21B 7/04 175/24 |
| 2005/0228905 | A1* | 10/2005 | Veeningen | ......... G06Q 10/0635 710/1 |
| 2005/0236184 | A1* | 10/2005 | Veeningen | .............. E21B 10/00 175/40 |
| 2007/0199721 | A1* | 8/2007 | Givens | ................... G06Q 10/06 166/382 |
| 2008/0319726 | A1 | 12/2008 | Berge et al. | |
| 2009/0157367 | A1* | 6/2009 | Meyer | ....................... E21B 7/04 703/10 |
| 2011/0036587 | A1 | 2/2011 | Pritchard et al. | |
| 2012/0109611 | A1 | 5/2012 | Loizzo et al. | |
| 2013/0275099 | A1* | 10/2013 | Frydman | ............ G06F 17/5009 703/2 |
| 2013/0341093 | A1* | 12/2013 | Jardine | ..................... E21B 7/00 175/40 |
| 2015/0370934 | A1* | 12/2015 | Pride | ................... G06F 17/5009 703/10 |
| 2016/0070024 | A1* | 3/2016 | Berard | ................. G01V 99/005 703/10 |
| 2017/0191359 | A1* | 7/2017 | Dursun | ................... E21B 47/12 |
| 2018/0051552 | A1* | 2/2018 | Li | ............................ E21B 7/04 |

OTHER PUBLICATIONS

International Search Report and Written Opinion dated Dec. 19, 2017 cited in Application No. PCT/US2017/057305, 11 pgs.

* cited by examiner

| Risk No. | Risk/Hazard Description | Effect | Prob'y of Occur (1-5) Init | Impact of Occur (1-5) Init | Initial Risk Grade (H,M,L) | Prob'y of Occur (1-5) Final | Impact of Occur (1-5) Final | Residual Risk Grade (H,M,L) | Actual or Potential NPT (hrs.) | Potential Cost of Event or NPT ($k) | Detailed Mitigating Solution | Solution Reasoning | Proposed Service Delivery | Primary Product Line Owner | Secondary Product Line Owner | Potential Mitigated NPT Reduction (hrs) | Potential Savings from Mitigation in NPT Reduction ($k) | Comments |
|---|---|---|---|---|---|---|---|---|---|---|---|---|---|---|---|---|---|---|
| 1 | Abnormal pressure from mudline to total depth (narrow window) | Kicks, NPT, Loss of well, extra casing strings, increase cost. | 5 | 3 | H | 5 | 2 | M | 96 | $4.8M | 302 | 304 | AutoTrak Gamma/Resistivity SoundTrak Acoustic Surface Logging Services Geomechanics Consulting (pre-drill) RT Geomechanics | Drilling Services | Geomechanics | 72 | $3.6M | 306 |
| 2 | wellbore failure (breakout) | wellbore enlargement, excessive cavings, hole cleaning issues | 5 | 4 | H | 5 | 2 | M | 12 | $600k | 312 | 314 | AutoTrak Gamma/Resistivity SoundTrak Acoustic LithoTrak image, Surface Logging Services, Geomechanics Consulting (pre-drill) RT Geomechanics | Drilling Services | Geomechanics | 9 | $150k | 316 |
| 3 | shallow water flow | wellbore collapse, uncontrolled kick (riserless) | 2 | 3 | M | 2 | 2 | L | 10 | $500k | 322 | 324 | AutoTrak Gamma/Resistivity with AccuFIT AP Signal - RT ECD Mgmt | Drilling Services | RT Advisory Services SLS - Signals | 3 | $350k | 326 |

FIG. 3

GEOMECHANICAL RISK AND HAZARD ASSESSMENT AND MITIGATION

CROSS-REFERENCE TO RELATED APPLICATIONS

The present application claims the benefit of U.S. Provisional Patent Application No. 62/410,991, filed Oct. 21, 2016, the contents of which are hereby incorporated by reference in their entirety.

BACKGROUND

The present disclosure relates to geomechanical risk and hazard assessment and mitigation.

Drilling subsurface boreholes in earth formations includes inherent risks (e.g., drilling risks, formation risks/hazards, geologic hazards, drilling events, etc.). For example, drilling outside of a safe operating window of pressure, fracture gradient, etc., may result in kicks, fluid loss (i.e., loss of circulation), tight hole, wellbore instability, blowouts, etc., which may increase non-production time (NPT), increase costs, cause environmental damage or injury to workers, etc. An increase in NPT can cost a drilling company millions of dollars, and can cause a drilling company's reputation to be harmed. It is therefore important to consider risk mitigation during drilling, completions, or production.

BRIEF SUMMARY

According to examples of the present disclose, techniques including methods, systems, and/or computer program products for geomechanical risk and hazard assessment and mitigation are provided. An example computer-implemented method may include generating, by a processor, a geomechanical model for a location for drilling a borehole. The method may further include performing a risk assessment to identify at least one risk associated with drilling the borehole. The method may further include updating, by the processor, the geomechanical model as a pre-drill geomechanical model by applying a mitigation solution to mitigate the at least one risk associated with drilling the borehole. The method may further include generating, by the processor, a drilling plan for drilling the borehole based on the pre-drill geomechanical model. The method may further include drilling the borehole based on the drilling plan.

According to additional examples of the present disclosure, an example system may include a memory comprising computer readable instructions and a processor for executing the computer readable instructions for performing a method. The method may include performing a risk assessment to identify at least one risk associated with drilling a borehole. The method may further include updating, by the processor, a geomechanical model as a pre-drill geomechanical model by applying a mitigation solution to mitigate the at least one risk associated with drilling the borehole. The method may further include generating, by the processor, a drilling plan for drilling the borehole based on the pre-drill geomechanical model. The method may further include drilling the borehole based on the drilling plan. The method may further include altering the drilling the borehole based on monitoring the drilling the borehole to collect borehole data during the drilling.

Additional features and advantages are realized through the techniques of the present disclosure. Other aspects are described in detail herein and are considered a part of the disclosure. For a better understanding of the present disclosure with the advantages and the features, refer to the following description and to the drawings.

BRIEF DESCRIPTION OF THE DRAWINGS

The subject matter which is regarded as the invention is particularly pointed out and distinctly claimed in the claims at the conclusion of the specification. The foregoing and other features, and advantages thereof, are apparent from the following detailed description taken in conjunction with the accompanying drawings in which:

FIG. 3 illustrates a risk assessment worksheet according to aspects of the present disclosure;

DETAILED DESCRIPTION

Figure 1:
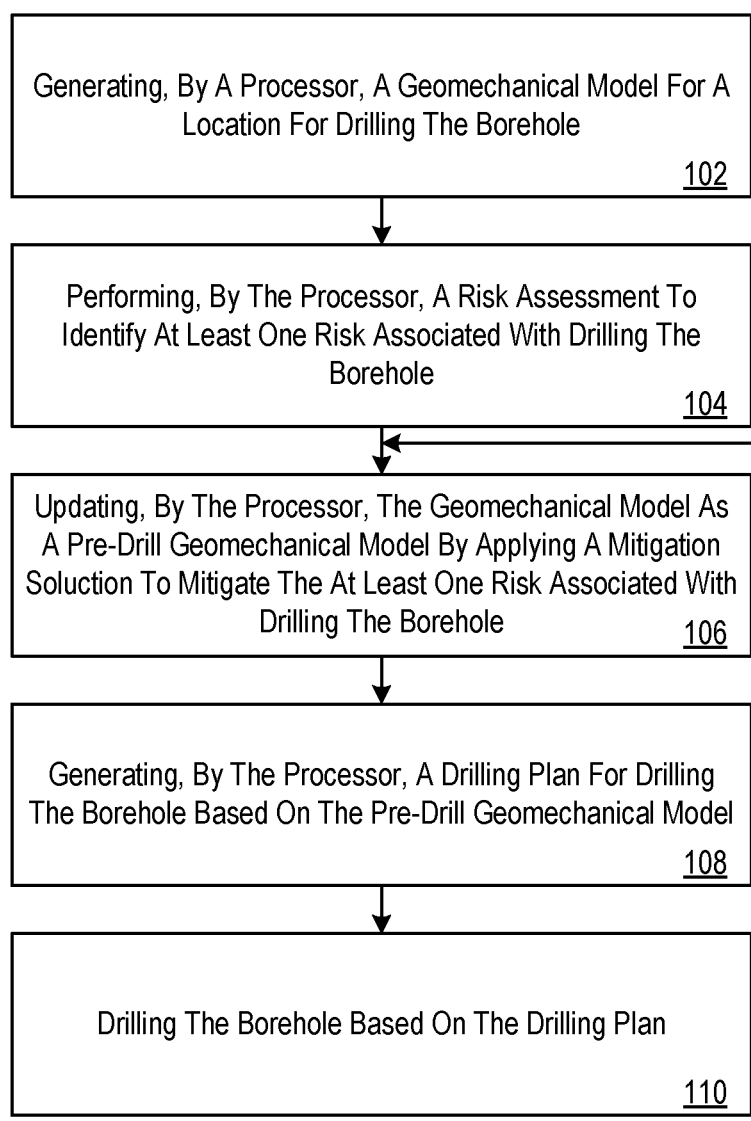
FIG. 1 illustrates a flow diagram of a method for geomechanical risk and hazard assessment and mitigation according to aspects of the present disclosure.

Various implementations are described below by referring to several examples of techniques for geomechanical risk and hazard assessment and mitigation. Generally, the present disclosure relates to identifying geomechanical risks and providing a solution to mitigate these risks for drilling a borehole. The risk management techniques described herein have been developed for a health, safety, and environment (HS&E) type focus to address safety risks in the oil and gas industry directly related to the geomechanical risks identified in geomechanical modeling. One example method includes: generating, by a processor, a geomechanical model for a location for drilling the borehole; performing a risk assessment to identify at least one risk associated with drilling the borehole; updating, by the processor, the geomechanical model as a first updated geomechanical model by applying a mitigation solution to mitigate the at least one risk associated with drilling the borehole; generating, by the processor, a drilling plan for drilling the borehole based on the first updated geomechanical model; and drilling the borehole based on the drilling plan.

The present disclosure uses a geomechanical modeling-influenced approach towards identifying and mitigating formation risks, using a modified risk management concept to analyze the probably of occurrence and the potential effects (e.g., kicks, loss circulation, tight hole, wellbore instability, etc.) commonly experienced during borehole drilling. The present techniques score the degree of severity of an event and determine a risk level if no action is taken to mitigate or prevent the risk, hazard, or event. Potential mitigation strategies to reduce the effect of these geomechanical-related risks, hazards, and events are determined and scored. This risk assessment identifies specific technologies and services that are useful to reduce risks if utilized in the pre-drill planning and execution phases of a drilling program.

The teachings of the present disclosure can be applied in a variety of well operations including planning, drilling, completion, and production. These operations may involve using one or more treatment agents to treat the drilling fluid, the formation fluid, the production fluid, a stimulation fluid, the wellbore, and/or equipment in the wellbore, such as production tubing. The treatment agents may be in the form of liquids, gasses, solids, semi-solids, and mixtures thereof. Illustrative treatment agents include, but are not limited to, fracturing and stimulation fluids, acids, steam, water, brine, corrosion inhibitors, $H_2S$-scavengers, oxygen scavengers, scale inhibitors, cement, permeability modifiers, drilling fluids, emulsifiers, demulsifiers, tracers, flow improvers, wellbore strengthening material, etc. Illustrative well operations include, but are not limited to, hydraulic fracturing, stimulation, tracer injection, cleaning, acidizing, steam injection, water-flooding, cementing, production screens, etc. In examples, the properties of the drilling fluid are altered during drilling. For example, the drilling fluid type and/or density may be changed. In additional examples, the rheology of the drilling fluid may be altered by adding treatments and additives such as formation strengthening additives and operations, fracture plugging agents, etc.

Example embodiments of the disclosure include or yield various technical features, technical effects, and/or improvements to technology. For instance, example embodiments of the disclosure provide the technical effect of generating a drilling plan to drill a borehole based on a geomechanical model that is generated based on a risk assessment that identifies risks associated with drilling the borehole. This technical effect is achieved as a result of the technical features of generating a geomechanical model, performing a risk assessment to identify a risk associated with drilling a borehole, updating the geomechanical model by applying a mitigation solution to mitigate the risk, generating a drilling plan for drilling the borehole, and drilling the borehole based on the drilling plan. Thus, example embodiments of the disclosure provide the technical effect of increasing non-production time at the borehole by identifying and mitigating risks. As a result of the aforementioned technical features and technical effects, example embodiments of the disclosure constitute an improvement to existing geomechanical risk and hazard assessment and mitigation technologies. It should be appreciated that the above examples of technical features, technical effects, and improvements to technology of example embodiments of the disclosure are merely illustrative and not exhaustive.

FIG. 1 illustrates a flow diagram of a method 100 for geomechanical risk and hazard assessment and mitigation according to aspects of the present disclosure. It should be appreciated that the method 100 may be performed by a suitable processing system, such as the processing system 200 of FIG. 2, the processing system 20 of FIG. 5, and/or by another suitable processing system.

At block 102, the method 100 includes generating, by a processor, a geomechanical model for a location for drilling the borehole. At block 104, the method 100 includes performing, by the processor, a risk assessment to identify at least one risk associated with drilling the borehole. At block 106, the method 100 includes updating, by the processor, the geomechanical model as a first updated geomechanical model by applying a mitigation solution to mitigate the at least one risk associated with drilling the borehole. At block 108, the method 100 includes generating, by the processor, a drilling plan for drilling the borehole based on the first updated geomechanical model. At block 110, the method 100 includes drilling the borehole based on the drilling plan. In examples, the method 100 returns to block 106 to provide for continuous, real-time updating of the geomechanical model. For example, the mitigation solution might change due to uncertainties in geology and changes to mitigation strategies.

Additional processes also may be included. For example, the method 100 may include monitoring the drilling of the borehole in real time to collect borehole data based on the drilling the borehole. The method 100 may further include updating the geomechanical model using the borehole data to generate a continuously or manually updated geomechanical model. An updated drilling plan can then be created based on the updated geomechanical model. Using the updated drilling plan, the drilling can be altered. For example, drilling parameters, such as drilling trajectory, drilling speed, drilling depth, drilling fluids etc., can be altered based on the updated drilling plan. In some examples, drilling the borehole and monitoring the drilling of the borehole in real time can be performed by a manual drilling system, an automated drilling system, or a combination thereof. It should be understood that the processes depicted in FIG. 1 represent illustrations, and that other processes may be added or existing processes may be removed, modified, or rearranged without departing from the scope and spirit of the present disclosure.

Figure 2:
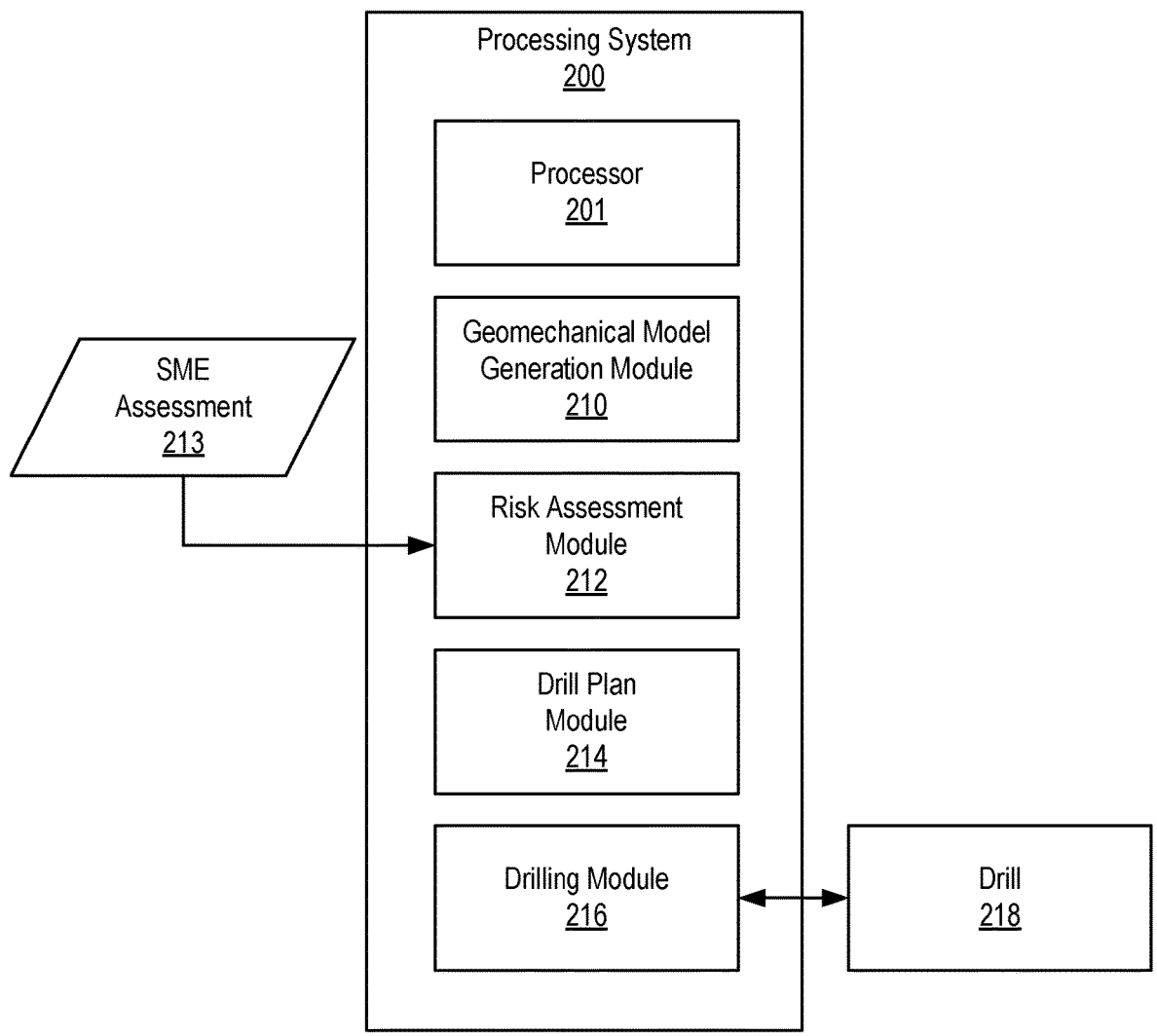
FIG. 2 illustrates a block diagram of a processing system for geomechanical risk and hazard assessment and mitigation according to examples of the present disclosure.

FIG. 2 illustrates a block diagram of a processing system 200 for geomechanical risk and hazard assessment and mitigation according to examples of the present disclosure. The various components, modules, engines, etc. described regarding FIG. 2 may be implemented as instructions stored on a computer-readable storage medium, as hardware modules, as special-purpose hardware (e.g., application specific hardware, application specific integrated circuits (ASICs), as embedded controllers, hardwired circuitry, etc.), or as some combination or combinations of these. In examples, the engine(s) described herein may be a combination of hardware and programming. The programming may be processor executable instructions stored on a tangible memory, and the hardware may include a processor 201 for executing those instructions. Thus a system memory can store program instructions that when executed by the processor 201 implement the engines described herein. Other engines may also be utilized to include other features and functionality described in other examples herein.

The processing system 200 may include processor 201, a geomechanical model generation module 210, a risk assessment module 212, a drill plan module 214, and a drilling module 216. Alternatively or additionally, the processing system 200 may include dedicated hardware, such as one or more integrated circuits, Application Specific Integrated Circuits (ASICs), Application Specific Special Processors (ASSPs), Field Programmable Gate Arrays (FPGAs), or any combination of the foregoing examples of dedicated hardware, for performing the techniques described herein.

The scoring and ranking is performed by a subject matter expert (SME) through an SME assessment 213 using a risk management worksheet as illustrated in FIG. 3. Initially, a pre-drill geomechanical model is presented to a group of SMEs. Each potential drilling/geological/formation risk (e.g., high pressure transition, unstable shale, weak bedding, etc.), hazard (e.g., influx, loss circulation, wellbore instability, etc.), and/or drilling event (e.g., stuck pipe, tight hole, etc.) is gathered from this geomechanical model. The drilling/geological/formation risks, hazards and/or drilling events are inputted into the geomechanical risk assessment worksheet 300.

The geomechanical model generation module 210 generates a geomechanical model of a borehole for an earth formation and hydrocarbon reservoir to be drilled. The geomechanical model provides details about borehole such as borehole pressures, wellbore stresses, formation rock properties, wellbore stability, sand production, optimizing production from fractured reservoirs, fault reactivation/leakage, and reservoir compaction, among others.

The risk assessment module 212 performs a risk assessment to identify risks associated with drilling the borehole. The risk assessment module 212 uses several different stages, including: pre-drill geomechanics analysis; scoring and ranking the occurrence and severity of the identified drilling risks, hazards and potential events; and determining a mitigation solution to reduce the potential effect of the risks.

With each one of these inputs, the potential effect is captured such as flow from the formation (gas, water, oil or solids), loss of fluids into the formation, or loss or collapse of the wellbore. The next step is scoring the probability of occurrence that a particular risk is realized and an effect or undesired effect might happen in the particular proposed well or project. Next the impact from the particular risk is scored if and effect or undesired event should occur.

For each risk, the risk assessment module 212 calculates the probability of occurrence and impact of occurrence indicate the initial unmitigated risk grade, such as from low to high (e.g., low, medium, high), if no mitigation strategies are applied to reduce or prevent the risk. Next, the SMEs identify mitigation solutions to prevent or reduce each of the geomechanical risks identified. In this post mitigation stage, the same scoring criteria of the probability of occurrence and impact of occurrence when a mitigation strategy is utilized. In examples, the mitigation strategy may be developing a geomechanical model, using technologies to calculate geomechanical boundaries, and/or using real-time monitoring services to detect any changes in the modeling due to uncertainties in geology or the lack of a fully calibrated, constrained geomechanical model.

The risk assessment module 212 then calculates an updated post-mitigated risk grade using the mitigation strategy designed to address the specific risk. The geomechanical risk assessment outlines each risk including its mitigating solution, reasoning, recommendations, and associated value of applying the mitigating solution verses having no plan or solution in place resulting in a potentially uncontrolled, unmanageable risk situation or drilling event.

The geomechanical model generation module 210 then updates the geomechanical model as a first updated geomechanical model by applying a mitigation solution to mitigate the at least one risk associated with drilling the borehole.

The drill plan module 214 generates a drilling plan for drilling the borehole based on the first updated geomechanical model. The drilling plan outlines the specific parameters used to drill the borehole, such as drilling depth, drilling trajectory, drilling speed, drilling fluids, and other parameters.

The drilling module 216 drills the borehole based on the drilling plan using the drill 218, which may be any suitable drill or similar apparatus used to drill the borehole. During drilling, the drilling module 216 may continuously monitor the drilling of the borehole in real time to collect borehole data through well-site information transfer specification (WITS) and/or well-site information transfer standard markup language (WITSML) or batch transfers based on the drilling the borehole, which the geomechanical model generation module 210 may then use to update the geometric model. WITS/WITSML provides a mechanism to transfer data or information from independent sources such as logging while drilling, mudlogging, drilling recorders, fluids, etc. into a processing system in which the geomechanical model reside. Then with this real-time data fed into the model, the geomechanical model is automatically updated with new calculations. The drill plan module 214 may, in some examples, update the drilling plan as an updated drilling plan based on an updated geomechanical model. The drilling module 216 can then alter the drilling of the borehole based on the updated drilling plan. Altering the drilling can include altering a drilling trajectory, a drilling speed, drilling fluids and/or a drilling depth.

FIG. 3 illustrates a risk assessment worksheet 300 according to aspects of the present disclosure. As illustrated, the risk assessment worksheet 300 includes a number of risks with risk assessment about each of the risks. The risk assessment information may include: risk number, risk/hazard description, effect, initial probability of occurrence initial, initial impact of occurrence, risk grade, final probability of occurrence, final impact of occurrence, residual risk grade, actual or potential non-production time, potential cost of event or non-production time, detailed mitigation solution, solution reasoning, proposed service delivery, primary product line owner, secondary product line owner, potential mitigated non-production time reduction, potential savings from mitigation in no-production time reduction, and comments.

The example risk assessment worksheet 300 includes three risks (e.g., risk nos. 1, 2, and 3). Risk no. 1, for example, has an associated risk/hazard of "abnormal pressure from mudline to total depth (narrow window)" with an effect of "kicks, NPT, loss of well, extra casing strings, increase cost." An initial probability of occurrence is 5 (on a scale of 1 to 5 with 1 being lowest and 5 being highest) and an initial impact of occurrence is 3 (also on a scale of 1 to 5 with 1 being lowest and 5 being highest). An initial risk grade is high (out of a scale of low, medium, and high). If a mitigation solution is implemented, as detailed in cell 306, the probably of occurrence remains 5 while the impact of occurrence is reduced to 2 and the residual grade is reduced to medium. The proposed mitigation solution may reduce NPT by 72 hours at a savings of $3.6 million. As illustrated in FIG. 3, additional risks may be included, although FIG. 3 illustrates only a few possible drilling risks and hazards. Other drilling risks and hazards may include narrow drilling margins, rapid abnormal pressure transitions, fissle formations, bedding plan failure, salt/coal/tar intervals, depleted zones, reactive formations, HTHP zones, rubble zones, fault zones, unconsolidated formations, shallow water flows, and micro/naturally fractured formations. This list is not intended to be limiting, and other risks and hazards may be possible.

Referring to FIG. 3, cell 306 states: "RT Geomechanics utilizing OnTrak-SoundTrak calculate pore pressure, collapse and fracture gradient to define safe operating window especially near salt. Other measurements such as Dxc, gas detection, and cavings analysis (SLS Mudlogging) enables calibration the pore pressure and collapse gradient."

Referring to FIG. 3, cell 304 states: "SoundTrak acoustic defines PP with less uncertainty than just resistivity in near salt applications due to less effect from salinity/mineralogy influences. Using both resistivity and acoustic narrows uncertainty of PP calculation (deviation between calculations). Gas detection allows for calibration of near balance pressure conditions. Cavings analysis identifies wellbore failure mode to calibrate models. Full-time real-time monitoring of geomechanics and wellbore behavior from RT Geomechanics group and SLS Mudlogging allows for constantly monitoring of changing conditions."

Referring to FIG. 3, cell 306 states: "more accurately define PP, reduced risk and chances of excessive NPT depending on geological uncertainties. Potential 96 hours of NPT from drilling reports estimated down to 24 hours for circulation just to build MW when overpressure increases. The excessive NPT time could easily be reduced due to maintaining MW within the safe operating window over this entire well eliminating need to raise MW proactively."

Referring to FIG. 3, cell 312 states: "RT Geomechanics to define collapse gradient utilizing SoundTrak acoustic. Perform breakout/DITF image analysis utilizing LithoTrak (OBM) or StarTrak (WBM) images. Analyze cavings for shear failure with assistance from SLS."

Referring to FIG. 3, cell 314 states: "SoundTrak acoustic is a valuable input into collapse gradient stress calculations for determining shear failure. Can estimate using offset acoustic data, but not as reliable if rock/geology changes. Images provide a clear indication of wellbore failure in most cases, especially for breakout. Can perform LWD relogs to determine if time-related wellbore failure is present. Angular shape of cavings help identify shear failure to help calibrate with log/image data."

Referring to FIG. 3, cell 316 states: "definitely more proactive in identifying early signs of stability and enforce barrier reduce the need to circulate for hole cleaning issues in this case from the excessive breakout from 12 hours down to 3 hours or more for reducing the amount of excess cavings circulation."

Referring to FIG. 3, cell 322 states: "Monitor seafloor with ROV, RT ECD management look for small fluxuations in annular pressure. Identify with specialized seismic identification to avoid areas of high risk for SWF. If flow occurs, use various control procedures such as pump and dump, weight up until stabilized, then continue drilling."

Referring to FIG. 3, cell 324 states: "Verify SWF at seabed with ROV (signs of flow at seabed with camera). Monitoring ECD for slight fluxuation (<100 psi) while drilling through a sand (detected by GR), is a good potential for SWF. In seismic, there is sometimes an indication of a sand pocket visible, that can be avoided in planning riserless section (different well location)."

Referring to FIG. 3, cell 326 states: "provides ability to detect SFW and react quickly, degree of SWF is the uncertainty; in this case with SWF, responded quicker to dramatically reduce flow by weighting up (pump and dump)."

Figure 4A:
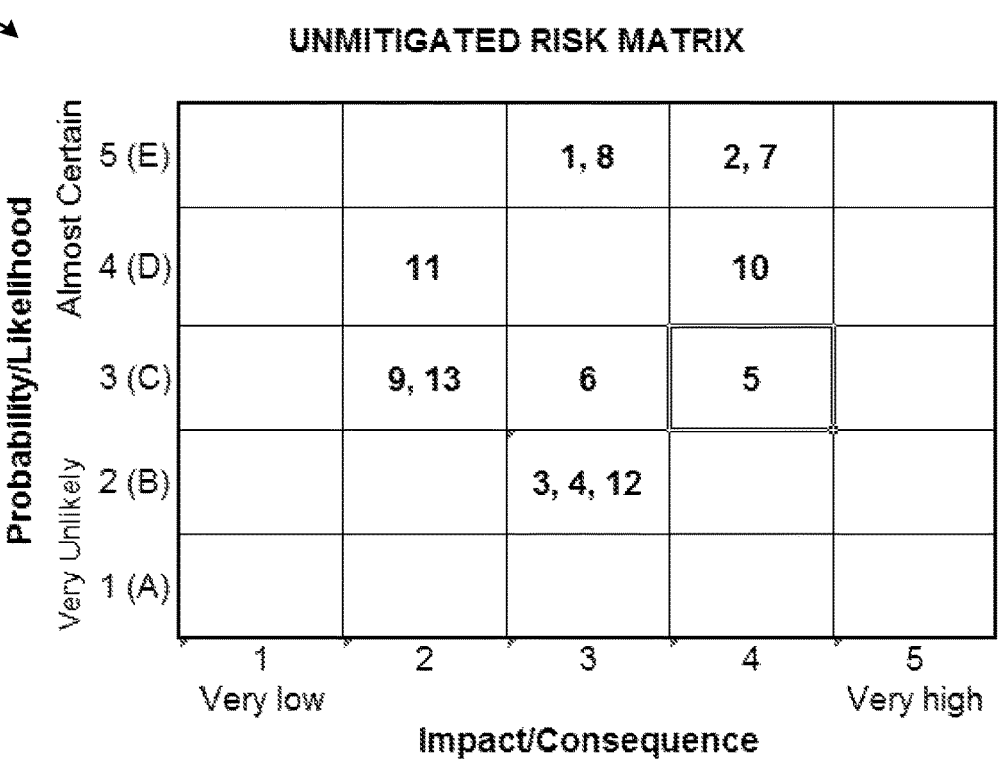
FIG. 4A illustrates an unmitigated risk matrix according to aspects of the present disclosure.

FIG. 4A illustrates an unmitigated risk matrix 400a according to aspects of the present disclosure. In particular, the unmitigated risk matrix 400a plots each risk (such as the risks indicated in the risk assessment worksheet 300) by risk number according to the impact/consequence of each risk versus the probability/likelihood of occurrence of each risk. For example, risk no. 1 of the risk assessment worksheet 300 has an initial probability (i.e., probability/likelihood) of occurrence of 5 and an initial impact (i.e., impact/consequence) of occurrence of 3. This is denoted by the "1" in the box corresponding to an impact/consequence of 3 and a probability/likelihood of 5.

Figure 4B:
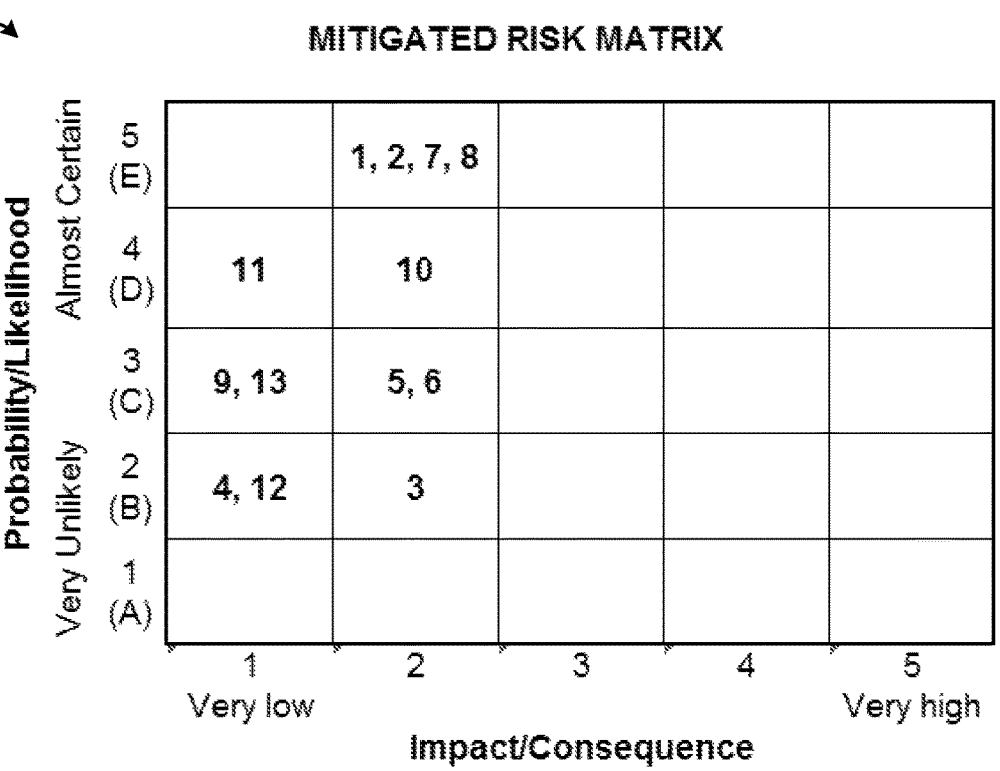
FIG. 4B illustrates a mitigated risk matrix according to aspects of the present disclosure.

FIG. 4B illustrates a mitigated risk matrix 400b according to aspects of the present disclosure. In particular, the mitigated risk matrix 400b plots each risk (such as the risks indicated in the risk assessment worksheet 300) by risk number according to the impact/consequence of each risk versus the probability/likelihood of occurrence of each risk factoring in the mitigation solution for the risk. For example, risk no. 1 of the risk assessment worksheet 300 has a final probability (i.e., probability/likelihood) of occurrence of 5 and an initial impact (i.e., impact/consequence) of occurrence of 2. This is denoted by the "1" in the box corresponding to an impact/consequence of 2 and a probability/likelihood of 5.

Using the unmitigated risk matrix 400a and the mitigated risk matrix 400b enables a person, such as a subject matter expert or customer, to see how risks are impacted as a result of the mitigation solution.

Figure 5:
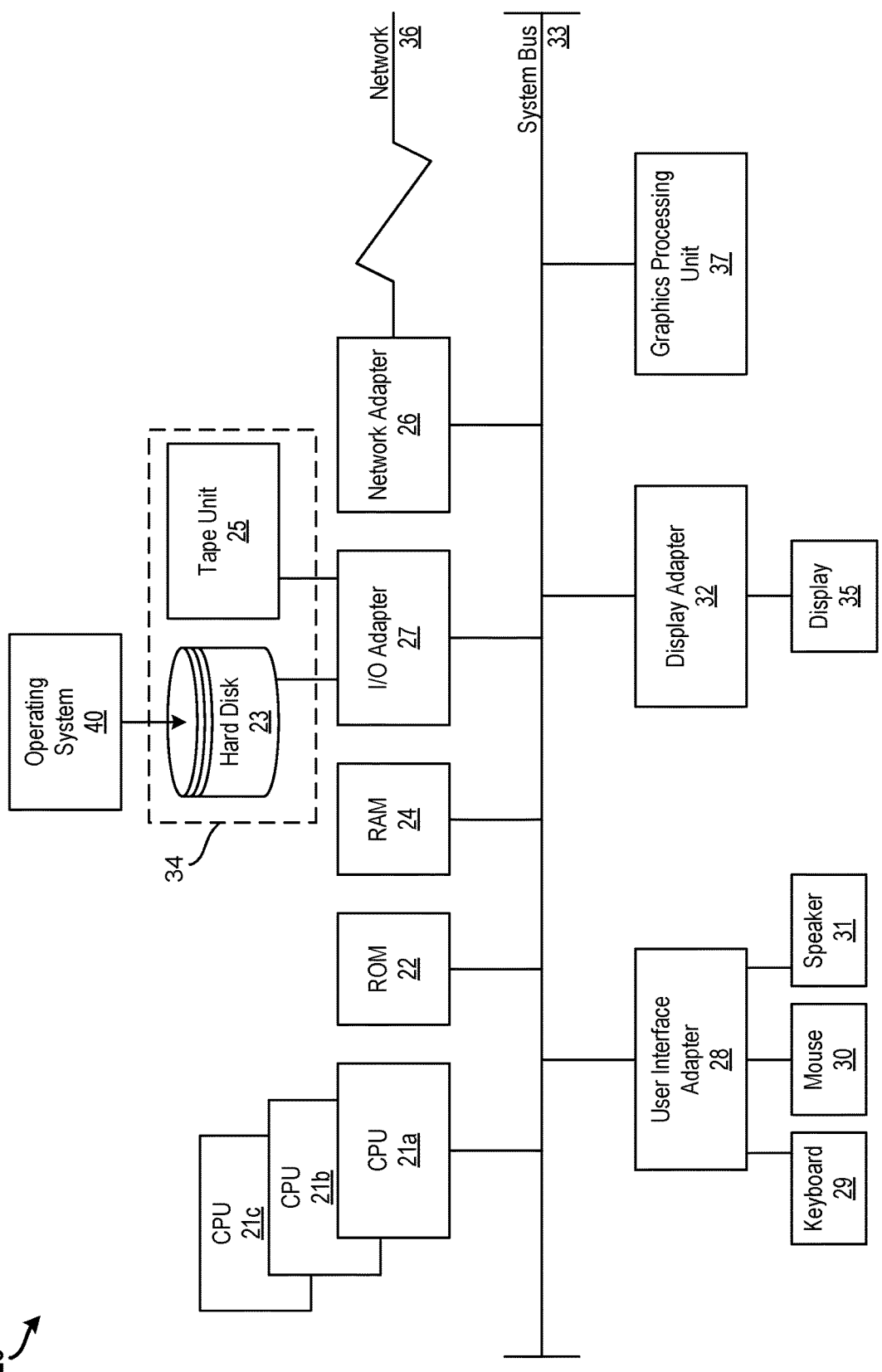
FIG. 5 illustrates a block diagram of a processing system for implementing the techniques described herein according to examples of the present disclosure.

It is understood in advance that the present disclosure is capable of being implemented in conjunction with any other type of computing environment now known or later developed. For example, FIG. 5 illustrates a block diagram of a processing system 20 for implementing the techniques described herein. In examples, processing system 20 has one or more central processing units (processors) 21a, 21b, 21c, etc. (collectively or generically referred to as processor(s) 21 and/or as processing device(s)). In aspects of the present disclosure, each processor 21 may include a reduced instruction set computer (RISC) microprocessor. Processors 21 are coupled to system memory (e.g., random access memory (RAM) 24) and various other components via a system bus 33. Read only memory (ROM) 22 is coupled to system bus 33 and may include a basic input/output system (BIOS), which controls certain basic functions of processing system 20.

Further illustrated are an input/output (I/O) adapter 27 and a communications adapter 26 coupled to system bus 33. I/O adapter 27 may be a small computer system interface (SCSI) adapter that communicates with a hard disk 23 and/or a tape storage drive 25 or any other similar component. I/O adapter 27, hard disk 23, and tape storage device 25 are collectively referred to herein as mass storage 34. Operating system 40 for execution on processing system 20 may be stored in mass storage 34. A network adapter 26 interconnects system bus 33 with an outside network 36 enabling processing system 20 to communicate with other such systems. In some examples, the processing system 20 may include a data source to bring data into the processing system 20. For example, a WITS/WITSML feed may provide borehole data to the processing system 20. In another example, the processing system 20 may feed data out to another processing system to provide real-time drilling data visualization and analytics. In some examples, the data may be fed into and out of the processing system 20 via the network adapter 26.

A display (e.g., a display monitor) 35 is connected to system bus 33 by display adaptor 32, which may include a graphics adapter to improve the performance of graphics intensive applications and a video controller. In one aspect of the present disclosure, adapters 26, 27, and/or 32 may be connected to one or more I/O busses that are connected to system bus 33 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 33 via user interface adapter 28 and display adapter 32. A keyboard 29, mouse 30, and speaker 31 may be interconnected to system bus 33 via user interface adapter 28, which may include, for example, a Super I/O chip integrating multiple device adapters into a single integrated circuit.

In some aspects of the present disclosure, processing system 20 includes a graphics processing unit 37. Graphics processing unit 37 is a specialized electronic circuit designed to manipulate and alter memory to accelerate the creation of images in a frame buffer intended for output to a display. In general, graphics processing unit 37 is very efficient at manipulating computer graphics and image processing, and has a highly parallel structure that makes it more effective than general-purpose CPUs for algorithms where processing of large blocks of data is done in parallel.

Thus, as configured herein, processing system 20 includes processing capability in the form of processors 21, storage capability including system memory (e.g., RAM 24), and mass storage 34, input means such as keyboard 29 and mouse 30, and output capability including speaker 31 and display 35. In some aspects of the present disclosure, a portion of system memory (e.g., RAM 24) and mass storage 34 collectively store an operating system such as the AIX® operating system from IBM Corporation to coordinate the functions of the various components shown in processing system 20.

The present techniques may be implemented as a system, a method, and/or a computer program product. The computer program product may include a computer readable storage medium (or media) or utilize real-time displays that can be monitored showing the results through having computer readable program instructions thereon for causing a processor to carry out aspects and updates to risk mitigation analysis of the present disclosure. The real-time displays can be located on the wellsite or remotely to monitor the drilling operations and in some cases provide the ability to download the latest data. Some of these real-time displays can include alarm or warning functionality.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some examples, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to aspects of the present disclosure. It will be understood that each block of the flowchart illustrations and/or block diagrams, and combinations of blocks in the flowchart illustrations and/or block diagrams, can be implemented by computer readable program instructions through manual or automated updates.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various aspects of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Set forth below are some embodiments of the foregoing disclosure:

Embodiment 1

A computer-implemented method for geomechanical risk and hazard assessment and mitigation, the method comprising: generating, by a processor, a geomechanical model for a location for drilling a borehole; performing a risk assessment to identify at least one risk associated with drilling the borehole; updating, by the processor, the geomechanical model as a pre-drill geomechanical model by applying a mitigation solution to mitigate the at least one risk associated with drilling the borehole; generating, by the processor, a drilling plan for drilling the borehole based on the pre-drill geomechanical model; and drilling the borehole based on the drilling plan.

Embodiment 2

The computer-implemented method of any prior embodiment, further comprising: monitoring the drilling the borehole in real time to collect borehole data during the drilling the borehole.

Embodiment 3

The computer-implemented method of any prior embodiment, further comprising: updating the pre-drill geomechanical model continuously as an updated geomechanical model based on the borehole data.

Embodiment 4

The computer-implemented method of any prior embodiment, further comprising: updating the drilling plan as an updated drilling plan based on the updated geomechanical model.

Embodiment 5

The computer-implemented method of any prior embodiment, further comprising: altering the drilling the borehole based on the updated drilling plan.

Embodiment 6

The computer-implemented method of any prior embodiment, wherein altering the drilling the borehole based on the updated drilling plan comprises altering at least one of a drilling trajectory, a drilling speed, and a drilling depth.

Embodiment 7

The computer-implemented method of any prior embodiment, wherein the drilling the borehole and the monitoring the drilling the borehole in real time to collect the borehole data is performed by an automated drilling system.

Embodiment 8

The computer-implemented method of any prior embodiment, wherein a subject matter expert performs the risk assessment to identify the at least one risk associated with drilling the borehole.

Embodiment 9

The computer-implemented method of any prior embodiment, wherein performing the risk assessment further comprises: associating with the at least one risk an initial probability of occurrence of the risk prior to applying the mitigation solution; associating with the at least one risk an initial impact of occurrence of the risk prior to applying the mitigation solution; and determining an initial risk grade for the at least one risk based on the initial probability of occurrence of the risk and the initial impact of occurrence of the risk prior to applying the mitigation solution.

Embodiment 10

The computer-implemented method of any prior embodiment, wherein performing the risk assessment further comprises: associating with the at least one risk a final probability of occurrence of the risk based on applying the mitigation solution subsequent to applying the mitigation solution; associating with the at least one risk a final impact of occurrence of the risk subsequent to applying the mitigation solution; and determining a final risk grade for the at least one risk based on the final probability of occurrence of the risk and the final impact of occurrence of the risk subsequent to applying the mitigation solution.

Embodiment 11

A system for geomechanical risk and hazard assessment and mitigation, the system comprising: a memory comprising computer readable instructions; and a processor for executing the computer readable instructions for performing a method, the method comprising: performing a risk assessment to identify at least one risk associated with drilling a borehole; updating, by the processor, a geomechanical model as a pre-drill geomechanical model by applying a mitigation solution to mitigate the at least one risk associated with drilling the borehole; generating, by the processor, a drilling plan for drilling the borehole based on the pre-drill geomechanical model; drilling the borehole based on the drilling plan; and altering the drilling the borehole based on monitoring the drilling the borehole to collect borehole data during the drilling.

Embodiment 12

The system of any prior embodiment, the method further comprising: updating the pre-drill geomechanical model continuously as an updated geomechanical model based on the borehole data; and updating the drilling plan as an updated drilling plan based on the updated geomechanical model.

Embodiment 13

The system of any prior embodiment, wherein a subject matter expert performs the risk assessment to identify the at least one risk associated with drilling the borehole.

Embodiment 14

The system of any prior embodiment, wherein performing the risk assessment further comprises: associating with the at least one risk an initial probability of occurrence of the risk prior to applying the mitigation solution; associating with the at least one risk an initial impact of occurrence of the risk prior to applying the mitigation solution; and determining an initial risk grade for the at least one risk based on the initial probability of occurrence of the risk and the initial impact of occurrence of the risk prior to applying the mitigation solution.

Embodiment 15

The system of any prior embodiment, wherein performing the risk assessment further comprises: associating with the at least one risk a final probability of occurrence of the risk based on applying the mitigation solution subsequent to applying the mitigation solution; associating with the at least one risk a final impact of occurrence of the risk subsequent to applying the mitigation solution; and determining a final risk grade for the at least one risk based on the final probability of occurrence of the risk and the final impact of occurrence of the risk subsequent to applying the mitigation solution.

The descriptions of the various examples of the present disclosure have been presented for purposes of illustration, but are not intended to be exhaustive or limited to the embodiments disclosed. Many modifications and variations will be apparent to those of ordinary skill in the art without departing from the scope and spirit of the described techniques. The terminology used herein was chosen to best explain the principles of the present techniques, the practical application or technical improvement over technologies found in the marketplace, or to enable others of ordinary skill in the art to understand the techniques disclosed herein.

Additionally, the term "about" is intended to include the degree of error associated with measurement of the particular quantity based upon the equipment available at the time of filing the application. For example, "about" can include a range of ±8% or 5%, or 2% of a given value.

While one or more embodiments have been shown and described, modifications and substitutions may be made thereto without departing from the spirit and scope of the invention. Accordingly, it is to be understood that the present invention has been described by way of illustrations and not limitation.

What is claimed is:

1. A computer-implemented method for geomechanical risk and hazard assessment and mitigation, the method comprising:
   generating, by a processor, a geomechanical model for a location for drilling a borehole;
   performing a risk assessment to identify at least one risk associated with drilling the borehole;
   updating, by the processor, the geomechanical model as a pre-drill geomechanical model by applying a mitigation solution to mitigate the at least one risk associated with drilling the borehole;
   generating, by the processor, a drilling plan for drilling the borehole based on the pre-drill geomechanical model; and
   drilling the borehole based on the drilling plan;
   wherein performing the risk assessment further comprises:
   associating with the at least one risk an initial probability of occurrence of the risk prior to applying the mitigation solution;
   associating with the at least one risk an initial impact of occurrence of the risk prior to applying the mitigation solution;
   determining an initial risk grade for the at least one risk based on the initial probability of occurrence of the risk and the initial impact of occurrence of the risk prior to applying the mitigation solution;
   associating with the at least one risk a final probability of occurrence of the risk based on applying the mitigation solution subsequent to applying the mitigation solution;
   associating with the at least one risk a final impact of occurrence of the risk subsequent to applying the mitigation solution; and
   determining a final risk grade for the at least one risk based on the final probability of occurrence of the risk and the final impact of occurrence of the risk subsequent to applying the mitigation solution.

2. The computer-implemented method of claim 1, further comprising:
   monitoring the drilling the borehole in real time to collect borehole data during the drilling the borehole.

3. The computer-implemented method of claim 2, further comprising:
   updating the pre-drill geomechanical model continuously as an updated geomechanical model based on the borehole data.

4. The computer-implemented method of claim 3, further comprising:
   updating the drilling plan as an updated drilling plan based on the updated geomechanical model.

5. The computer-implemented method of claim 4, further comprising:
   altering the drilling the borehole based on the updated drilling plan.

6. The computer-implemented method of claim 5, wherein altering the drilling the borehole based on the updated drilling plan comprises altering at least one of a drilling trajectory, a drilling speed, and a drilling depth.

7. The computer-implemented method of claim 2, wherein the drilling the borehole and the monitoring the drilling the borehole in real time to collect the borehole data is performed by an automated drilling system.

8. The computer-implemented method of claim 1, wherein a subject matter expert performs the risk assessment to identify the at least one risk associated with drilling the borehole.

9. A system for geomechanical risk and hazard assessment and mitigation, the system comprising:
   a memory comprising computer readable instructions; and
   a processor for executing the computer readable instructions for performing a method, the method comprising:
   performing a risk assessment to identify at least one risk associated with drilling a borehole;
   updating, by the processor, a geomechanical model as a pre-drill geomechanical model by applying a mitigation solution to mitigate the at least one risk associated with drilling the borehole;

generating, by the processor, a drilling plan for drilling the borehole based on the pre-drill geomechanical model;
drilling the borehole based on the drilling plan; and
altering the drilling the borehole based on monitoring the drilling the borehole to collect borehole data during the drilling,
wherein performing the risk assessment further comprises:
associating with the at least one risk an initial probability of occurrence of the risk prior to applying the mitigation solution;
associating with the at least one risk an initial impact of occurrence of the risk prior to applying the mitigation solution;
determining an initial risk grade for the at least one risk based on the initial probability of occurrence of the risk and the initial impact of occurrence of the risk prior to applying the mitigation solution;
associating with the at least one risk a final probability of occurrence of the risk based on applying the mitigation solution subsequent to applying the mitigation solution;
associating with the at least one risk a final impact of occurrence of the risk subsequent to applying the mitigation solution; and
determining a final risk grade for the at least one risk based on the final probability of occurrence of the risk and the final impact of occurrence of the risk subsequent to applying the mitigation solution.

10. The system of claim 9, the method further comprising:
updating the pre-drill geomechanical model continuously as an updated geomechanical model based on the borehole data; and
updating the drilling plan as an updated drilling plan based on the updated geomechanical model.

11. The system of claim 9, wherein a subject matter expert performs the risk assessment to identify the at least one risk associated with drilling the borehole.

12. The computer-implemented method of claim 1, further comprising:
prior to updating the geomechanical model, determining the mitigation solution to reduce a potential effect of the at least one risk.

* * * * *